(12) United States Patent
Ohori et al.

(10) Patent No.: US 6,335,232 B1
(45) Date of Patent: Jan. 1, 2002

(54) METHOD OF MANUFACTURING A THIN FILM TRANSISTOR

(75) Inventors: Mitsutaka Ohori, Gifu; Shiro Nakanishi, Ohgaki, both of (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 09/165,771

(22) Filed: Oct. 2, 1998

(30) Foreign Application Priority Data

Oct. 6, 1997 (JP) .............................................. 9-272772

(51) Int. Cl.[7] .......................... H01L 21/44; H01L 21/84
(52) U.S. Cl. ...................... 438/158; 438/159; 438/486; 438/487
(58) Field of Search ................................ 438/158, 159, 438/487, 486

(56) References Cited

U.S. PATENT DOCUMENTS

| | | | |
|---|---|---|---|
| 5,313,076 A | * | 5/1994 | Yamazaki et al. ............. 257/66 |
| 5,366,926 A | | 11/1994 | Mei et al. |
| 5,445,676 A | * | 8/1995 | Takagi ......................... 118/719 |
| 5,529,951 A | | 6/1996 | Noguchi et al. |
| 5,534,445 A | | 7/1996 | Tran et al. |
| 5,545,571 A | * | 8/1996 | Yamazaki et al. ............. 437/21 |
| 5,571,744 A | | 11/1996 | Demirlioglu et al. |
| 5,572,047 A | * | 11/1996 | Hiroki et al. .................. 257/72 |
| 5,632,820 A | * | 5/1997 | Taniyama et al. ............ 118/724 |
| 5,899,709 A | * | 5/1999 | Yamazaki et al. ........... 438/151 |
| 6,020,224 A | * | 2/2000 | Shimogaichi et al. ........ 438/158 |

OTHER PUBLICATIONS

Bonnel et al., "Comparison of the Hydrogenation Techniques on Polysilicon TFT's", IEEE Colloqium on Poly–Si Devices and Applications, pp. 22/1–22/4, 1993, month unknown.
Pollack et al., "Hydrogen Passivation of Polysilicon MOSFET's From a Plasma Nitride Source", IEEE Electron Device Letters, vol. EDL–5, No. 11, pp. 468–470 1984, Month Unknown.

* cited by examiner

Primary Examiner—Amir Zarabian
Assistant Examiner—Michael S. Lebentritt
(74) Attorney, Agent, or Firm—Cantor Colburn LLP

(57) ABSTRACT

On a transparent substrate where a gate electrode is formed, an amorphous silicon film is deposited by plasma CVD with a gate insulating film interposed therebetween. The silicon film is heated in an nitrogen atmosphere at 430±20° C. for an hour or longer to discharge hydrogen remaining in the film when it is formed. The silicon film is then melted by laser irradiation to crystallize, to thereby form a polycrystalline silicon film serving as an active region. Thus, when amorphous silicon is crystallized to form a polycrystalline silicon film, it is made possible to prevent creation of a rough film surface and penetration of impurity ions in the atmosphere into the polycrystalline silicon.

14 Claims, 6 Drawing Sheets

METHOD OF MANUFACTURING A THIN FILM TRANSISTOR

BACKGROUND OF THE INVENTION

1. Field of the Invention

The present invention relates to a method of manufacturing a thin film transistor suitable for applications such as a switching device for displaying a pixel in a display panel of an active matrix type.

2. Description of the Related Art

FIG. 1 is a cross sectional view showing a structure of a thin film transistor of a bottom gate type.

This thin film transistor is formed as follows.

On a surface of an insulating transparent substrate 1, a gate electrode 2 of high melting point metal (refractory metal) such as tungsten or chromium is provided. The gate electrode 2 has a tapered shape with its width gradually increasing toward the transparent substrate 1. On the transparent substrate 1 on which the gate electrode 2 is located, a silicon oxide film 4 is deposited, with a silicon nitride film 3 interposed therebetween. The silicon nitride film 3 prevents penetration of impurities contained in the substrate 1 into an active region which will be described below, and the silicon oxide film 4 acts as a gate insulating film. A polycrystalline silicon film 5 is deposited on the silicon oxide film 4 crossing over the gate electrode 2. The polycrystalline silicon film 5 functions as an active region of the thin film transistor.

A stopper 6 of insulating material such as silicon oxide is disposed on the polycrystalline silicon film 5. The region of the film 5 covered with the stopper acts as a channel region 5c, while the remaining regions of the polycrystalline silicon film 5 act as a source region 5s and a drain region 5d. A silicon oxide film 7 and a silicon nitride film 8 are deposited on the polycrystalline silicon film 5 including the stopper 6 formed thereon. These silicon oxide and nitride films 7 and 8, respectively, are interlayer insulating films protecting the polycrystalline silicon film 5 including the source and drain regions 5s and 5d.

Contact holes 9 are formed at prescribed positions of the silicon oxide and nitride films 7 and 8 located on the source and drain regions 5s and 5d. At the contact hole 9 portions, a source electrode 10s and a drain electrode 10d are disposed connected to the source and drain regions 5s and 5d, respectively. An acrylic resin layer 11 transparent to visible light is deposited on the silicon nitride film 8 where source and drain electrodes 10s and 10d are formed. The acrylic resin layer 11 fills in the recesses created by the gate electrode 2 and the stopper 6, to thereby planarize the surface.

A contact hole 12 is formed in the portion of the acrylic resin layer 11 located on the source electrode 10s. A transparent electrode 13 of indium tin oxide (ITO) or the like connected to the source electrode 10s through the contact hole 12 is formed spreading over the acrylic resin layer 11. This transparent electrode 13 forms a pixel electrode in the application of a liquid crystal display panel.

A plurality of the above-described thin film transistors and pixel electrodes are arranged in a matrix on the transparent substrate 1. These transistors respond to a scan control signal applied to the gate electrode 2 to provide image data received at the drain electrode 10d to the pixel electrodes.

The polycrystalline silicon film 5 is preferably formed to have a grain size large enough to function as an active region of the thin film transistor. One of the commonly-known methods for forming the polycrystalline silicon film with a large grain is a laser annealing method utilizing an excimer laser. According to this laser annealing method, amorphous silicon is deposited on the silicon oxide film 4 serving as a gate insulating film, and is irradiated by an excimer laser, so that silicon is melted and then crystallized. Since a use of the laser annealing method can eliminate the need for processing the transparent substrate 1 at a high temperature, a low-melting point glass substrate can be employed as the transparent substrate 1.

The amorphous silicon film, which will be turned into the polycrystalline silicon film 5, is formed by plasma CVD performed at a low temperature. As a result, hydrogen contained in silane which is used as reaction gas remains in the film. If the amorphous silicon film is melted by laser irradiation with a large amount of hydrogen remaining in the film, hydrogen is suddenly expelled from the film, resulting in a rough film surface. Consequently, operation characteristics of a transistor having such a polycrystalline silicon film as an active region will be deteriorated.

SUMMARY OF THE INVENTION

Therefore, an object of the present invention is to avoid creation of a rough film surface during crystallization of an amorphous silicon film.

A method of manufacturing a thin film transistor according to the present invention includes a first step of depositing a refractory metal film on a main surface of a substrate and etching the film to a prescribed pattern to form a gate electrode, a second step of depositing a gate insulating film on the substrate to cover the gate electrode, a third step of depositing a semiconductor film on the gate insulating film, and a fourth step of depositing an interlayer insulating film on the semiconductor film. The above third step includes a step of depositing an amorphous silicon film on the gate insulating film, heating the amorphous silicon film at 430±20° C. to expel hydrogen contained therein, and melting the amorphous silicon film to crystallize.

Another method of manufacturing a thin film transistor according to the present invention includes a first step of depositing a semiconductor film on a main surface of a substrate, a second step of depositing a gate insulating film on the semiconductor film, a third step of depositing an electrically conductive film on the gate insulating film and etching the electrically conductive film to a prescribed pattern crossing over the semiconductor film to form a gate electrode, and a fourth step of depositing an interlayer insulating film on the semiconductor film to cover the gate electrode. The first step includes a step of depositing an amorphous silicon film on the main surface of said substrate, heating the silicon film at 430±20° C. to expel hydrogen contained therein, and melting the amorphous silicon film to crystallize it.

In the above method of manufacturing a thin film transistor according to the present invention, the above third or first step of heating the amorphous silicon film is carried out in an inert gas atmosphere. Gas such as nitrogen gas can be used as the inert gas.

In the above heating step of the present invention, for example, prior to heating, the substrate is placed in a preparation chamber disposed adjacent to a heat treatment chamber, gas in the heat treatment and preparation chambers are replaced by the inert gas, and the substrate is relocated from the preparation chamber to the heat treatment chamber.

Further, according to the present invention, the step of heating the amorphous silicon layer is carried out for one hour or longer.

The step of heating the amorphous silicon film according to the present invention allows reduction in hydrogen concentration of the amorphous silicon film formed on the gate insulating film to 1 atomic % or lower.

By thus performing heat treatment of the amorphous silicon film, hydrogen remaining in the film when it is formed can be gradually expelled out of the film. Performing heat treatment for a given period of time allows reduction in hydrogen in the amorphous silicon film to a prescribed value or lower, preventing a large amount of hydrogen from being suddenly emitted from the film when the amorphous silicon film is melted.

Therefore, the present invention can avoid roughness at the surface of the film which otherwise results from sudden generation of hydrogen when the amorphous silicon film is melted.

Since heat treatment for eliminating hydrogen is carried out in an nitrogen atmosphere, it is possible to avoid entry of impurity ions into the amorphous silicon film. As a result, operation characteristics of a thin film transistor having the polycrystalline silicon film as an active region can be improved.

DESCRIPTION OF PREFERRED EMBODIMENTS

Figure 1:
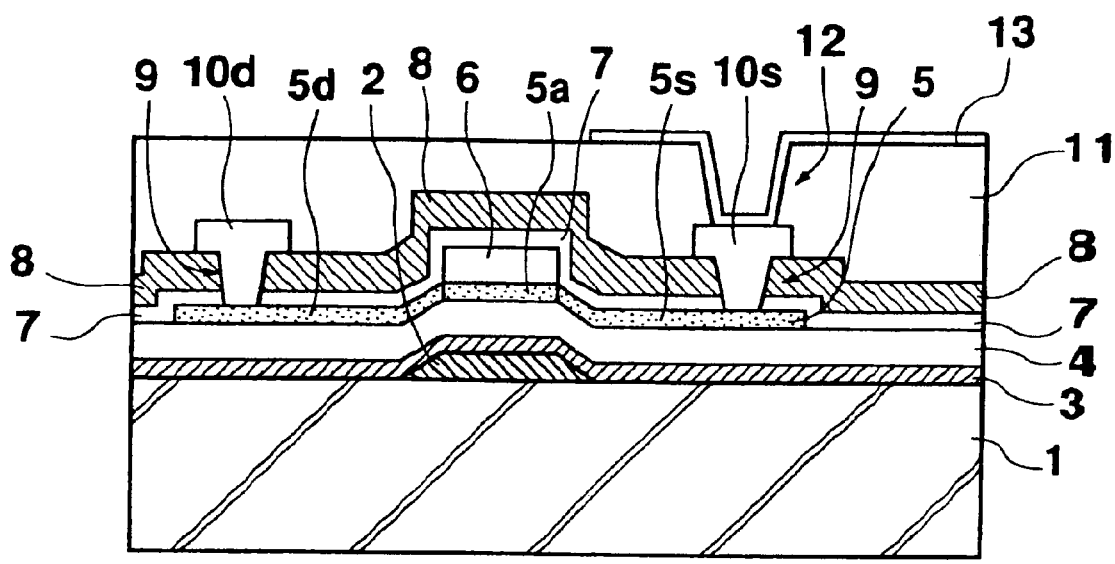
FIG. 1 is a cross sectional view showing a structure of a conventional thin film transistor.
Figure 2A:
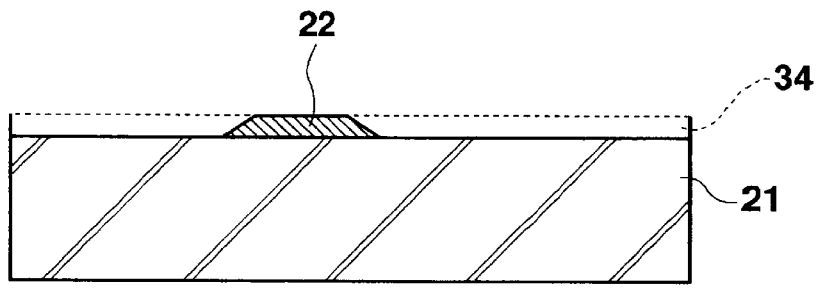
FIGS. 2A, 2B, 2C, 2D, 2E, and 2F are cross sectional views showing respective steps of a first embodiment of the present invention.
Figure 2B:
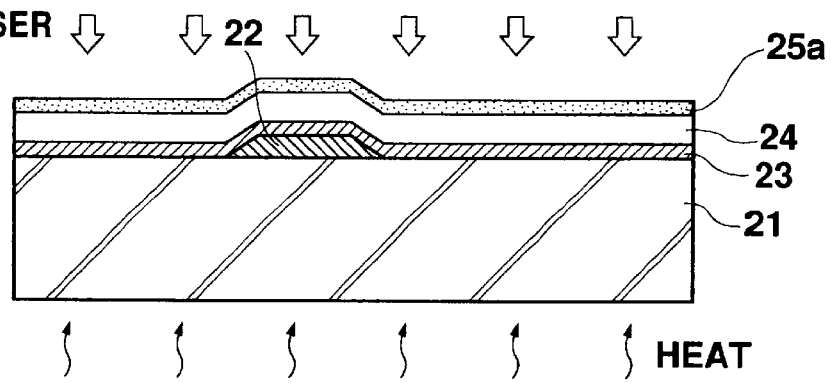
Figure 2C:
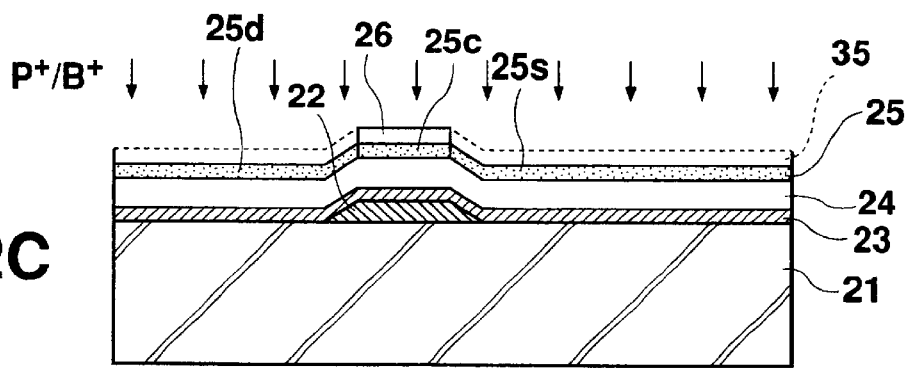
Figure 2D:
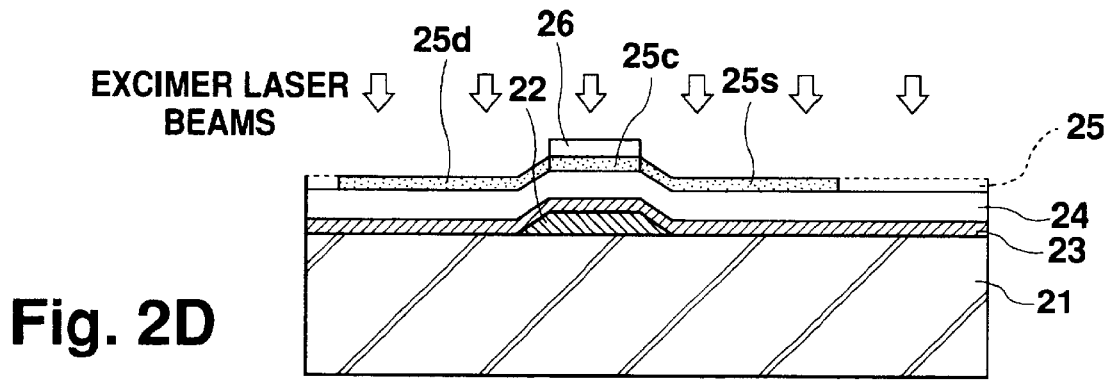
Figure 2E:
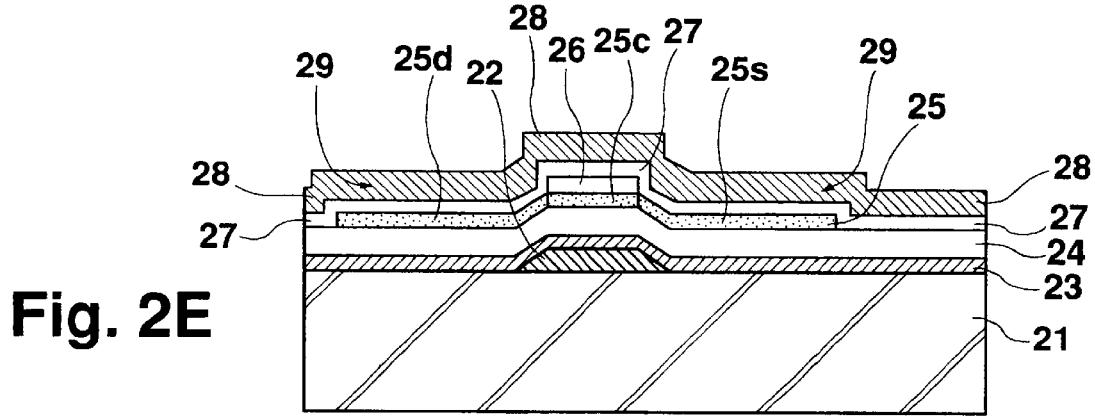
Figure 2F:
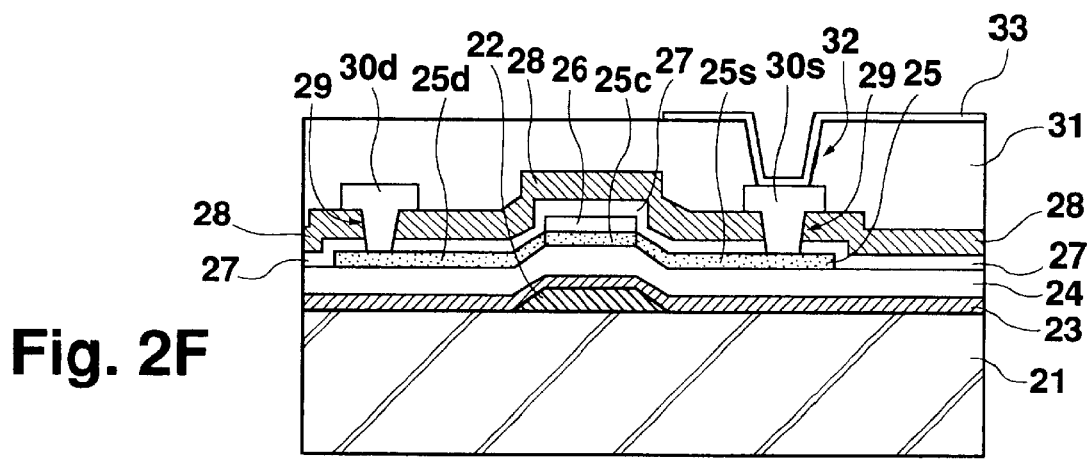
Figure 3A:
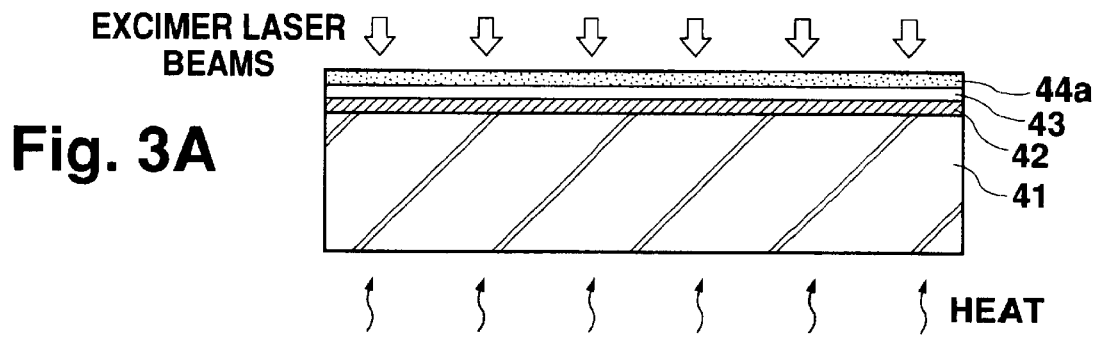
FIGS. 3A, 3B, 3C, 3D, 3E, and 3F are cross sectional views showing respective steps of a second embodiment of the present invention.
Figure 3B:
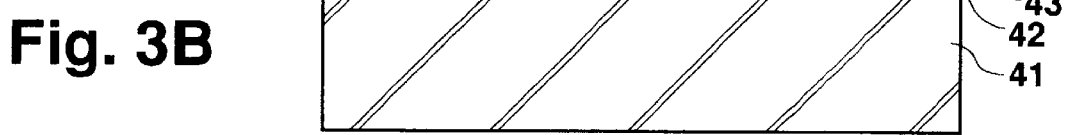
Figure 3C:
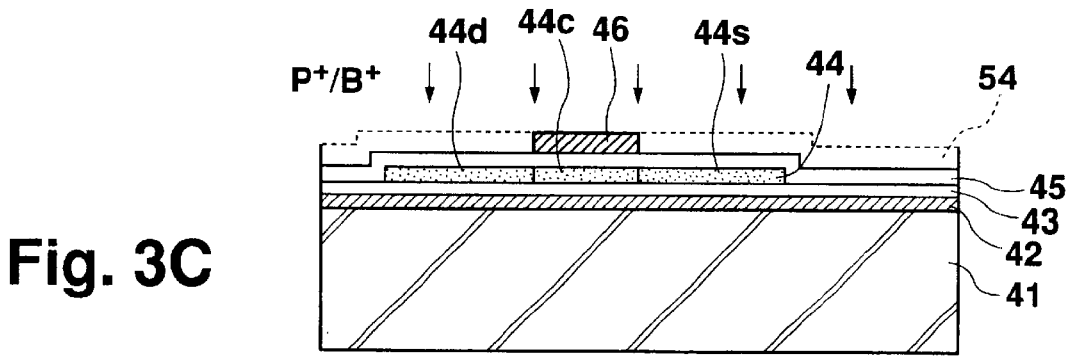
Figure 3D:
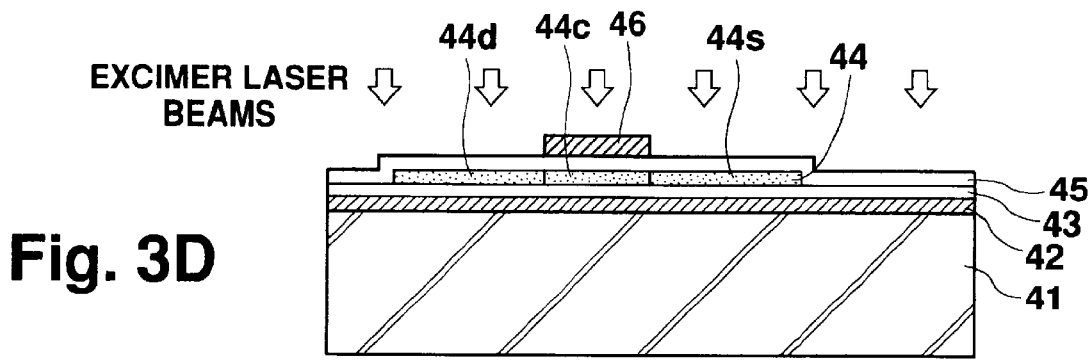
Figure 3E:
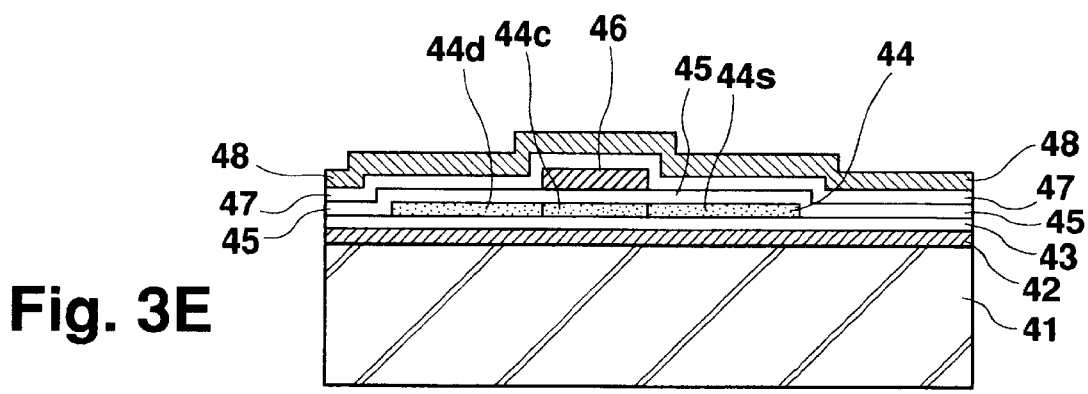
Figure 3F:
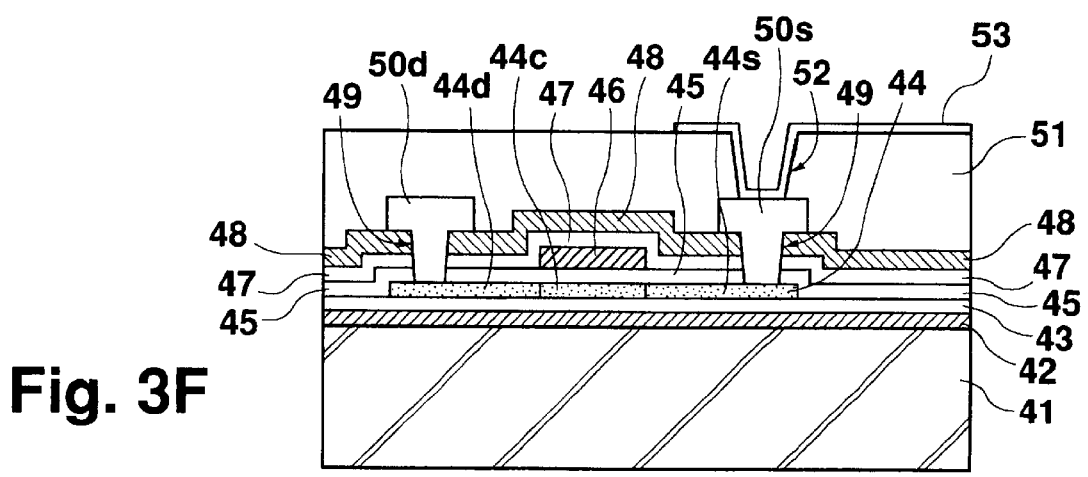

FIGS. 2A–2F are cross sectional views showing steps 2A–2F in the first embodiment of a method of manufacturing a thin film transistor according to the present invention.

(a) Step 2A

On an insulating transparent substrate 21, refractory metal, such as chromium, molybdenum, aluminum, or aluminum alloy is formed by sputtering to form a refractory metal film 34. This refractory metal film 34 is patterned to a predetermined shape to form a gate electrode 22. In this patterning process, the gate electrode 22 is formed in a tapered shape by taper etching so that its width increases toward the transparent substrate 21.

(b) Step 2B

Silicon nitride is deposited on the transparent substrate 21 by plasma CVD, and subsequently silicon oxide is deposited thereon, to thereby form a silicon nitride film 23 for preventing emission of impurity ions from the transparent electrode 21 and a silicon oxide film 24 acting as a gate insulating film. Further, silicon is deposited on the silicon oxide film 23 similarly by plasma CVD to form an amorphous silicon film 25a. The transparent substrate 21 and the amorphous silicon layer 25a are heated to a temperature of 430° C. (±20° C.), and this heat treatment is continued for one hour or longer (preferably, two hours). Due to the heat treatment, hydrogen contained in the silicon film 25a about 10 atomic percent thereof when the film is formed decreases to 1 atomic percent or lower. The silicon film 25a is irradiated by an excimer laser to be heated until amorphous silicon is melted. Since hydrogen contained in the silicon film 25a is significantly decreased compared to the value during formation, it will not be suddenly expelled from the film when silicon is melted. Consequently, silicon is crystallized without having a rough surface, resulting in a polycrystalline silicon film 25.

(c) Step 2C

Silicon oxide is deposited on the polycrystalline silicon film 25 to form a silicon oxide film 35. The film 35 is patterned to a shape corresponding to that of the gate electrode 22 to form a stopper 26 overlapping the gate electrode 22. For formation of the stopper 26, a resist layer is formed covering the silicon oxide film 35, and the resist layer is exposed to light from the back surface side of the transparent substrate 21 using the gate electrode 22 as a mask, so as to prevent misalignment of the mask. Using the stopper 26 as a mask, the polycrystalline silicon film 26 is doped with p-type or n-type ions corresponding to the type of the transistor to form. More specifically, the part of the polycrystalline silicon film 25 that is not covered by the stopper 26 is doped with p-type ions such as boron as impurities for forming a p-channel transistor, while it is doped with n-type ions such as phosphorus as impurities for forming an n-channel transistor. By thus doping with the impurities, regions showing p-type or n-type conductivity is formed at the polycrystalline film 25 except in the region covered by the stopper 26. These regions located at either side of the stopper 26 function as a source region 25s and a drain region 25d.

(d) Step 2D

The polycrystalline silicon film 25 having source and drain regions 25s and 25d, respectively, is irradiated by an excimer laser and heated to such a temperature that silicon is not melted. Consequently, impurity ions in the source and drain regions 25s and 25d are activated. The polycrystalline silicon film 25 is patterned to an island leaving a predetermined width on either side of the stopper 26 (gate electrode 22), to thereby isolate transistors from one another.

(e) Step 2E

Silicon oxide is deposited on the polycrystalline silicon film 25 by plasma CVD, and subsequently silicon nitride is also deposited, to thereby form an interlayer insulating film including two layers of a silicon oxide film 27 and a silicon nitride film 28. After thus forming silicon oxide and nitride films 27 and 28, a heating process is performed in an nitrogen atmosphere as an inert gas atmosphere to cause hydrogen ions contained in the silicon nitride film 28 to enter the polycrystalline silicon film 25. The temperature for this heating process should be in such a range where sufficient movement of hydrogen ions is ensured and the transparent substrate 21 does not soften or melt, suitably in a range of 350–450° C. Hydrogen ions in the silicon nitride film 28 are introduced to the polycrystalline silicon film 25 through the silicon oxide film 27, which is formed to a have a small thickness corresponding to the thickness of the silicon nitride film 28, ensuring supply of a necessary amount of ions to the polycrystalline silicon film 25. As a result, crystal defects in the polycrystalline silicon film 25 can be filled with hydrogen ions.

(f) Step 2F

Contact holes 29 penetrating the silicon oxide and nitride films 27 and 28 are formed corresponding to the source and drain regions 25s and 25d. At these contact hole 29 portions, a source electrode 30s and a drain electrode 30d of metal such as aluminum are formed by, for example, patterning aluminum sputtered on the silicon nitride film 28 having the contact holes 29 formed therein. Subsequently, a solution of acrylic resin is applied on the silicon nitride film 28 where the source and drain electrodes 30s and 30d are formed, followed by baking, to form an acrylic resin layer 31. This acrylic resin layer 31 planarizes the surface by filling in the recesses created by the stopper 26 and the source and drain electrodes 30s and 30d. A contact hole 32 penetrating the acrylic resin layer 31 is formed on the source electrode 30s, and a transparent electrode 33 of ITO or the like connected to the source electrode 30s is formed at this contact hole 32 portion. The transparent electrode 33 can be formed by, for example, patterning ITO sputtered on the acrylic resin layer 31 having the contact hole 32 is formed therein.

Through the above-described steps, a thin film transistor of a bottom gate type is formed.

FIGS. 3A–3F are cross sectional views showing steps 3A–3F of the second embodiment of the present method of manufacturing a thin film transistor.

(a) Step 3A

On an insulating transparent substrate 41, silicon nitride and then silicon oxide are deposited by plasma CVD, to thereby form a silicon nitride film 42 preventing emission of impurity ions from the transparent substrate 41, and a silicon oxide film 43 allowing deposition of a polycrystalline silicon film 44. Silicon is also deposited by plasma CVD to form an amorphous silicon film 44a. The transparent substrate 41 and the amorphous silicon film 44a are then heated to 430° C. (±20° C.) for a period of 1 hour or longer (preferably 2 hours). This heat treatment is the same as that performed in Step 2B of the first embodiment shown in FIG. 2B. The silicon film 44a is irradiated by an excimer laser to be heated until amorphous silicon is melted. As a result, silicon is crystallized to form a polycrystalline silicon film 44.

(b) Step 3B

The polycrystalline silicon film 44 is patterned to a prescribed shape so as to correspond to the position where the transistor is to be formed, and then separated for each transistor. After such separation of the polycrystalline silicon film 44, silicon oxide is deposited by plasma CVD to form a silicon oxide film 45 acting as a gate insulating film.

(c) Step 3C

Refractory metal such as chromium and molybdenum is formed by sputtering to form a refractory metal film 54. This refractory metal film 54 is patterned to a prescribed shape crossing over the polycrystalline silicon film 45 to form a gate electrode 46. Using this gate electrode 46 as a mask, the polycrystalline silicon film is doped with p-type or n-type ions as impurities corresponding to the type of the transistor to be formed. By thus doping the impurities, regions of p-type or n-type conductivity are formed at the polycrystalline silicon film 44 except in the region that is covered by the gate electrode 46. These regions function as a source region 44s and a drain region 44d.

(d) Step 3D

The polycrystalline silicon film 44 doped with impurity ions of a predetermined conductivity type is irradiated by an excimer laser to be heated to such a temperature that silicon is not melted. Consequently, impurity ions in the source and drain regions 44s and 44d are activated.

(e) Step 3E

Silicon oxide is deposited on the silicon oxide film 45 by plasma CVD to cover the gate electrode 46, followed by deposition of silicon nitride. As a result, an interlayer insulating film including two layers of a silicon oxide film 47 and a silicon nitride film 48 is formed. After thus forming the silicon oxide and nitride films 47 and 48, heat treatment is performed in a nitrogen atmosphere to cause hydrogen ions in the silicon nitride film 48 to penetrate into the polycrystalline silicon film 45. This heat treatment corresponds to that in Step 2E of the first embodiment shown in FIG. 2E.

Since hydrogen ions easily diffuse between the polycrystalline silicon film 44 and the gate electrode 46 through their interface, hydrogen ions penetrate from the side of the gate electrode 46 into the part of the polycrystalline silicon film 44 covered by the gate electrode 46. Therefore, no problems arise if the gate electrode 46 formed of refractory metal does not conduct hydrogen ions. As a result, crystal defects in the polycrystalline silicon film 44 are filled with hydrogen ions.

(f) Step 3F

Contact holes 49 penetrating the silicon oxide films 45 and 47 and the silicon nitride film 48 are formed corresponding to the source and drain regions 44s and 44d. At these contact hole 49 portions, a source electrode 50s and a drain electrode 50d are formed of metal such as aluminum. Subsequently, a solution of acrylic resin is applied onto the silicon nitride film 48 having these source and drain electrodes 50s and 50d, respectively, and a baking process is performed, to thereby form an acrylic resin layer 51. The acrylic resin layer 51 planarizes the surface by filling in the recesses formed by the gate electrode 46 and the source and drain electrodes 50s and 50d. A contact hole 52 penetrating the acrylic layer 51 is formed on the source electrode 50s, and at this portion where the contact hole 52 is formed a transparent electrode 53 connected to the source electrode 50s is formed of ITO or the like.

Through the above-described steps 3A–3F, a thin film transistor of a bottom gate type is completed.

It should be noted that the thickness of the respective films recited as an example in the above-described embodiments is an optimum value in particular conditions and it is not necessarily limited to such value.

Figure 4:
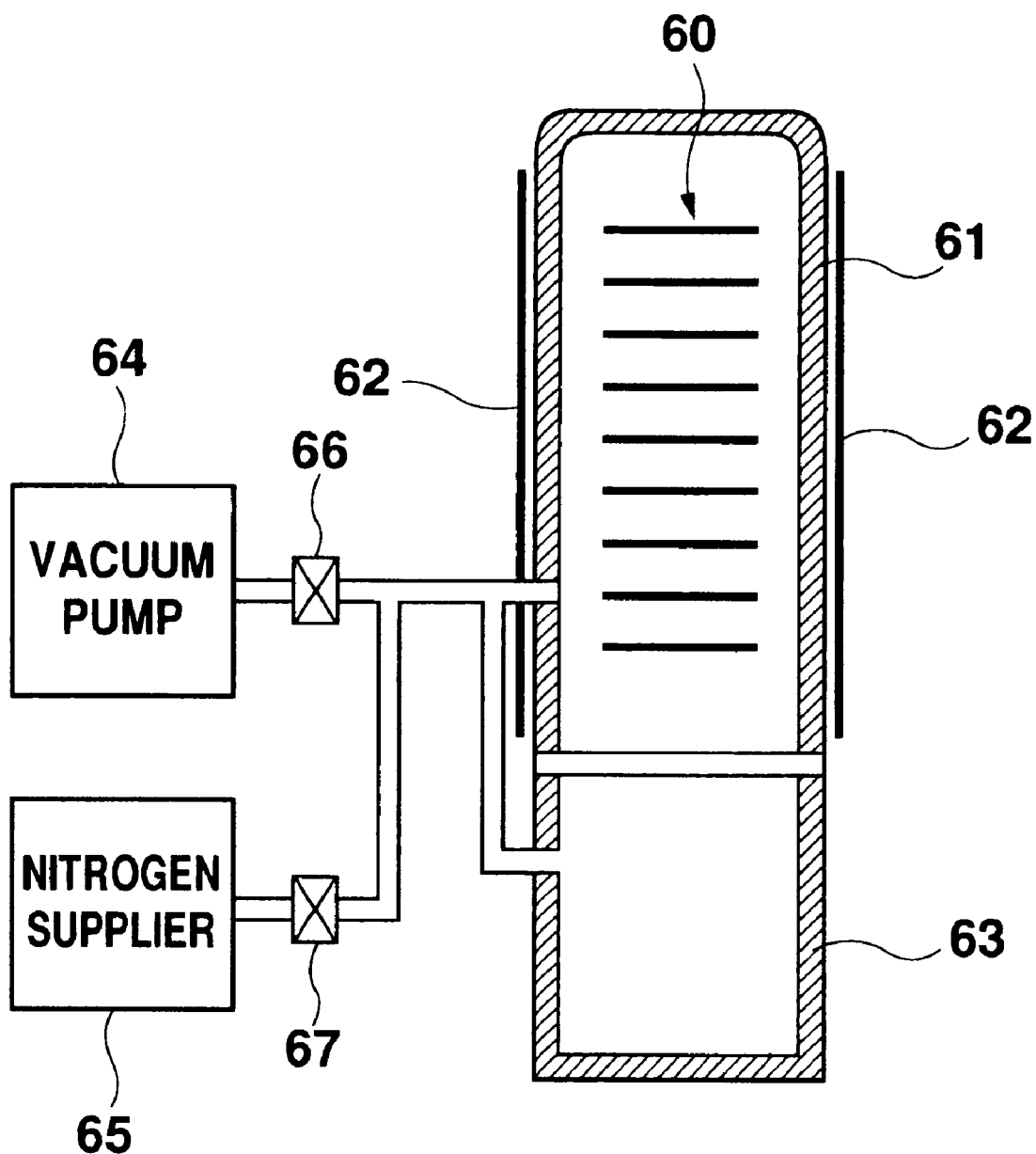
FIG. 4 is a view schematically showing an electric furnace used for heat treatment of a substrate according to the present invention.

FIG. 4 schematically shows a structure of an electric furnace annealer used in heat treatment for elimination of hydrogen in the second step of the first embodiment or in the first step of the second embodiment.

The electric furnace annealer includes a chamber 61, a heater 62, and a load-lock chamber 63 (i.e. preparation chamber), and is connected to a vacuum pump 64 and a nitrogen supplier 65. The chamber 61 accommodates a given number of substrates 60 having an amorphous silicon film deposited thereon. The heater 62 is disposed surrounding the chamber 61 to heat inside of the chamber 61 to a predetermined temperature (430±20° C.) and maintain this temperature. The load-lock chamber 63 is disposed adjacent to the chamber 61 for taking in the substrate 60 from outside and supplying it to the chamber 61, temporarily holding the substrate 60 removed from the chamber 61 after completion of the treatment, and supplying it to the outside. The load-lock chamber 63 is provided to prevent the substrate 60 which is still at a high temperature from being exposed to the outside atmosphere including impurity ions when the substrate 60 is taken out of the chamber 61.

The vacuum pump 64 is connected to the chamber 61 and the load-lock chamber 63 through a gate valve 66 for exhausting the air in the chamber 61 and the load-lock chamber 63 to attain a vacuum state. The nitrogen supplier 65 is connected to the chamber 61 and the load-lock chamber 63 through a gate valve 67 for introducing nitrogen gas to the chamber 61 and load-lock chamber 63 in a vacuum state.

Heat treatment of the substrate 60 having an amorphous silicon film formed thereon is carried out by the following steps. Before beginning the treatment, the heater 62 is electrified and inside of the chamber 61 is maintained at a given temperature. First, a predetermined number of substrates 60 are introduced to the load-lock chamber 63, and the chamber 61 and the load-lock chamber 63 are shut off from the outside air. The vacuum pump 64 is activated by opening the gate valve 66 to exhaust the air in the chamber 61 and the load-lock chamber 63, thereby attaining a vacuum state. The gate valve 66 is then closed and the gate valve 67 is opened to fill the chamber 61 and the load-lock chamber 63 with nitrogen gas. The substrate 60 is moved from the load-lock chamber 63 to the chamber 61 and heat treatment is initiated. After a given time period has lapsed while maintaining the given temperature, the substrate 60 is moved from the chamber 61 to the load-lock chamber 63. The temperature of the substrate 60 is gradually lowered to be near the room temperature, and then the load-lock chamber 63 is opened to take out the substrate 60.

By thus carrying out the heat treatment of the substrate 60, hydrogen concentration of the amorphous silicon film can be reduced before further processing while preventing impurities such as sodium and sulfur contained in the atmosphere from attaching to the surface of the amorphous silicon film. As a result, when the amorphous silicon film is melted and crystallized, it is made possible to prevent entry of impurities into the film and also to avoid creation of a rough film surface which would otherwise result from polycrystallizing process.

What is claimed is:

1. A method of manufacturing a thin film transistor comprising:
    a first step of depositing a refractory metal film on a main surface of a substrate, and etching the film to a predetermined pattern to form a gate electrode;
    a second step of depositing a gate insulating film on said substrate to cover said gate electrode;
    a third step of depositing a semiconductor film on said gate insulating film; and
    a fourth step of depositing an interlayer insulating film on said semiconductor film; wherein
    said third step includes a step of depositing an amorphous silicon film on said gate insulating film, heating the amorphous silicon film at 430±20° C. to eliminate hydrogen included therein and melting the amorphous silicon film so as to crystallize.

2. The method of manufacturing a thin film transistor according to claim 1, wherein
    the step of heating said amorphous silicon film in said third step is carried out in an inert gas atmosphere.

3. The method of manufacturing a thin film transistor according to claim 2, wherein
    said inert gas atmosphere is a nitrogen gas atmosphere.

4. A method of manufacturing a thin film transistor, comprising:
    a first step of depositing a refractory metal film on a main surface of a substrate, and etching the film to a predetermined pattern to form a gate electrode;
    a second step of depositing a gate insulating film on said substrate to cover said gate electrode;
    a third step of depositing a semiconductor film on said gate insulating film; and
    a fourth step of depositing an interlayer insulating film on said semiconductor film; wherein
    said third step includes depositing an amophous silicon film on said gate insulating film, heating the amorphous silicon film at 430±20° C. to eliminate hydrogen included therein and melting the amorphous silicon film so as to crystallize, and
    said third step further includes placing said substrate in a preparation chamber disposed adjacent to a heat treatment chamber, replacing gas in the heat treatment chamber and the preparation chamber by inert gas, and relocating said substrate from the preparation chamber to the heat treatment chamber to begin heat treatment.

5. The method of manufacturing a thin film transistor according to claim 1, wherein
    the step of heating said amorphous silicon film in said third step is carried out for an hour or longer.

6. A method of manufacturing a thin film transistor comprising:
    a first step of depositing a refractory metal film on a main surface of a substrate, and etching the film to a predetermined pattern to form a gate electrode;
    a second step of depositing a gate insulating film on said substrate to cover said gate electrode;
    a third step of depositing a semiconductor film on said gate insulating film; and
    a fourth step of depositing an interlayer insulating film on said semiconductor film; wherein
    said third step includes a step of depositing an amorphous silicon film on said gate insulating film, heating the amorphous silicon film to eliminate hydrogen included therein to 1 atomic percent or less, and melting the amorphous silicon film so as to crystallize.

7. A method of manufacturing a thin film transistor, comprising:
    a first step of depositing a semiconductor film on a main surface of a substrate;
    a second step of depositing a gate insulating film on said semiconductor film;
    a third step of depositing an electrically conductive film on said gate insulating film and etching the electrically conductive film to a predetermined pattern crossing over said semiconductor film, to thereby form a gate electrode; and
    a fourth step of depositing an interlayer insulating film on said semiconductor film to cover said gate electrode; wherein
    said first step includes depositing an amorphous silicon film on said main surface of said substrate, heating the silicon film at 430±20° C. to eliminate hydrogen included therein and melting the amorphous silicon film so as to crystallize.

8. The method of manufacturing a thin film transistor according to claim 7, wherein
    the step of heating said amorphous silicon film in said first step is carried out in an inert gas atmosphere.

9. The method of manufacturing a thin film transistor according to claim 8, wherein
    said inert gas atmosphere is a nitrogen gas atmosphere.

10. A method of manufacturing a thin film transistor, comprising:
    a first step of depositing a semiconductor film on a main surface of a substrate;
    a second step of depositing a gate insulating film on said semiconductor film;
    a third step of depositing an electrically conductive film on said gate insulating film and etching the electrically conductive film to a predetermined pattern crossing over said semiconductor film, to thereby form a gate electrode; and
    a fourth step of depositing an interlayer insulating film on said semiconductor film to cover said gate electrode; wherein
    said first step includes depositing an amorphous silicon film on said main surface of said substrate, heating the silicon film at 430±20° C. to eliminate hydrogen included therein and melting the amorphous silicon film so as to crystallize, said heating said amorphous silicon film in said first step is carried out in an inert gas atmosphere, and said first step further includes placing said substrate in a preparation chamber disposed adjacent to a heat treatment chamber, replacing gas in the heat treatment chamber and the preparation chamber by inert gas, and relocating said substrate from the preparation chamber to the heat treatment chamber to begin heat treatment.

11. The method of manufacturing a thin film transistor according to claim 8, wherein the step of heating said amorphous silicon film in said first step is carried out for an hour or longer.

12. A method of manufacturing a thin film transistor, comprising:

a first step of depositing a semiconductor film on a main surface of a substrate;

a second step of depositing a gate insulating film on said semiconductor film;

a third step of depositing an electrically conductive film on said gate insulating film and etching the electrically conductive film to a predetermined pattern crossing over said semiconductor film, to thereby form a gate electrode; and a fourth step of depositing an interlayer insulating film on said semiconductor film to cover said gate electrode; wherein said first step includes depositing an amorphous silicon film on said main surface of said substrate, heating the silicon film to eliminate hydrogen included therein such that the hydrogen concentration is gradually decreased to 1 atomic percent or less, and melting the amorphous silicon film so as to crystallize.

13. A method of manufacturing a thin film transistor comprising:

a first step of depositing a refractory metal film on a main surface of a substrate, and etching the film to a predetermined pattern to form a gate electrode;

a second step of depositing a gate insulating film on said substrate to cover said gate electrode;

a third step of depositing a semiconductor film on said gate insulating film; and a fourth step of depositing an interlayer insulating film on said semiconductor film; wherein said third step includes a step of depositing an amorphous silicon film on said gate insulating film, heating the amorphous silicon film at 430±20° C. to eliminate hydrogen included therein and melting the amorphous silicon film so as to crystallize; and wherein said third step includes a step of placing said substrate in a preparation chamber disposed adjacent to a heat treatment chamber, replacing gas in the heat treatment chamber and the preparation chamber by inert gas, and relocating said substrate from the preparation chamber to the heat treatment chamber to begin heat treatment; and wherein the step of heating said amorphous silicon film in said first step is carried out in an inert gas atmosphere.

14. A method of manufacturing a thin film transistor, comprising:

a first step of depositing semiconductor film on a main surface of a substrate;

a second step of depositing a gate insulating film on said semiconductor film;

a third step of depositing an electrically conductive film on said gate insulating film and etching the electrically conductive film to a predetermined pattern crossing over said semiconductor film, to thereby form a gate electrode; and a fourth step of depositing an interlayer insulating film on said semiconductor film to cover said gate electrode; wherein said first step includes a step of depositing an amorphous silicon film on said gate insulating film, heating the amorphous silicon film at 430±20° C. to eliminate hydrogen included therein and melting the amorphous silicon film so as to crystallize; and wherein said first step includes a step of placing said substrate in a preparation chamber disposed adjacent to a heat treatment chamber, replacing gas in the heat treatment chamber and the preparation chamber by inert gas, and relocating said substrate from the preparation chamber to the heat treatment chamber to start heat treatment.

* * * * *

UNITED STATES PATENT AND TRADEMARK OFFICE
CERTIFICATE OF CORRECTION

PATENT NO. : 6,335,232 B1
DATED : January 1, 2002
INVENTOR(S) : Ohori et al.

It is certified that error appears in the above-identified patent and that said Letters Patent is hereby corrected as shown below:

<u>Title page,</u>
Item [57], ABSTRACT,
Line 4, after "in" delete "an" and insert therefor -- a --

<u>Column 3,</u>
Line 18, after "in" delete "an" and insert therefor -- a --
Line 60, before "film" delete "oxide" and insert therefor -- nitride --
Line 62, after "silicon" delete "layer" and insert therefor -- film --

<u>Column 4,</u>
Line 18, after "film" delete "26" and insert therefor -- 25 --
Line 46, after "in" delete "an" and insert therefor -- a --

<u>Column 5,</u>
Line 13, after "32" delete "is"
Lines 45 and 66, after "film" delete "45" and insert therefor -- 44 --

Signed and Sealed this

Twenty-first Day of June, 2005

JON W. DUDAS
*Director of the United States Patent and Trademark Office*